US012425179B1

(12) United States Patent
Narayanan et al.

(10) Patent No.: US 12,425,179 B1
(45) Date of Patent: Sep. 23, 2025

(54) TIMING RECOVERY FOR IN-BAND COMMUNICATION IN INDUCTIVE POWER TRANSFER SYSTEMS

(71) Applicant: Apple Inc., Cupertino, CA (US)

(72) Inventors: Sriram Narayanan, Los Gatos, CA (US); Xing Zhou, San Jose, CA (US); Srinath Hosur, Fremont, CA (US); Alireza Safaee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 53 days.

(21) Appl. No.: 18/581,183

(22) Filed: Feb. 19, 2024

Related U.S. Application Data

(60) Provisional application No. 63/580,774, filed on Sep. 6, 2023.

(51) Int. Cl.
*H04L 7/033* (2006.01)
*H03L 7/08* (2006.01)

(52) U.S. Cl.
CPC ............ *H04L 7/033* (2013.01); *H03L 7/0807* (2013.01)

(58) Field of Classification Search
CPC ....... H04L 7/033; H04L 7/0029; H04L 7/007; H04B 5/26; H04B 5/266; H04B 5/79; H03L 7/099; H03L 7/093; H03L 7/08; H03L 7/085; H02J 50/10; H02J 50/80
See application file for complete search history.

(56) References Cited

U.S. PATENT DOCUMENTS 5,272,730 A * 12/1993 Clark .................... H03L 7/089 375/376
8,493,826 B1 * 7/2013 Oberg .................... G11B 27/24 369/47.28
2006/0104399 A1 * 5/2006 Byun .................... H03D 13/004 375/376
2007/0041485 A1 * 2/2007 Chang .................... H03L 7/113 375/376
2023/0418238 A1 * 12/2023 Moe .................... G04F 10/005
2025/0030427 A1 * 1/2025 Moe .................... H03L 7/1075

OTHER PUBLICATIONS

Dries van Wageningen, Toine Staring, "The Qi Wireless Power Standard", 14th International Power Electronics and Motion Control Conference, EPE-PEMC 2010 (Year: 2010).*
Wenxing Zhong and S. Y. Ron Hui, "Charging Time Control of Wireless Power Transfer Systems Without Using Mutual Coupling Information and Wireless Communication System", IEEE Transactions on Industrial Electronics, vol. 64, No. 1, Jan. 2017 (Year: 2017).*

* cited by examiner

*Primary Examiner* — Aristocratis Fotakis
(74) *Attorney, Agent, or Firm* — FLETCHER YODER PC

(57) ABSTRACT

A clock recovery system for recovering an in-band communication clock in a wireless power transfer system can in include: a phase locked loop; and a bit decision block and a multiplexer that cooperate to selectively provide the error signal to the loop filter responsive to detected bits in the in-band communication bitstream. The phase locked loop can further include: a phase detector that computes an error signal from a difference between an instantaneous peak location and an estimated peak location correlated to a symbol in an in-band communication bitstream; a loop filter that selectively receives the error signal; and a voltage controlled oscillator that adjusts its output frequency responsive to an output of the loop filter.

20 Claims, 8 Drawing Sheets

TIMING RECOVERY FOR IN-BAND COMMUNICATION IN INDUCTIVE POWER TRANSFER SYSTEMS

CROSS-REFERENCE TO RELATED APPLICATIONS

This application claims priority to U.S. Provisional Application No. 63/580,774, filed Sep. 6, 2023, entitled "Timing Recovery for In-Band Communication in Inductive Power Transfer Systems," which is incorporated by reference herein in its entirety.

BACKGROUND

Electronic devices, such as smart phones, tablet computers, smart watches, wireless earphones, styluses, etc. may employ wireless power transfer to facilitate charging of batteries within the devices. In some applications, wireless power transmitting devices and wireless power receiving devices may use in-band communications, in which parameters of the wirelessly transferred power are modulated, to allow for communication between devices such as power feedback control.

SUMMARY

A clock recovery system for recovering an in-band communication clock in a wireless power transfer system can in include: a phase locked loop; and a bit decision block and a multiplexer that cooperate to selectively provide the error signal to the loop filter responsive to detected bits in the in-band communication bitstream. The phase locked loop can further include: a phase detector that computes an error signal from a difference between an instantaneous peak location and an estimated peak location correlated to a symbol in an in-band communication bitstream; a loop filter that selectively receives the error signal; and a voltage controlled oscillator that adjusts its output frequency responsive to an output of the loop filter.

The multiplexer can receive the error signal at a first input and a zero signal at a second input. The bit decision block can be responsive to known bits in the in-band communication bitstream. The multiplexer and bit decision block and multiplexer can cooperate to provide the error signal to the loop filter responsive to the known bits and to provide the zero signal to the loop filter responsive to bits other than the known bits. The known bits can be stop bits. The known bits can be 1 bits. The known bits can be 0 bits.

The multiplexer can receive the error signal at a first input and the error signal plus an offset signal at a second input. The bit decision block can be responsive to known bits in the in-band communication bitstream. The multiplexer and bit decision block and multiplexer can cooperate to provide the error signal to the loop filter responsive to the known bits and to provide the error signal plus the offset signal to the loop filter responsive to bits other than the known bits. The known bits can be 1 bits, and the bits other than the known bits can be 0 bits. The known bits can be 0 bits, and the bits other than the known bits can be 1 bits.

The phase locked loop and bit decision block can be implemented using digital circuitry. The phase locked loop and bit decision block can be implemented using programmable circuitry.

A clock recovery system for recovering an in-band communication clock in a wireless power transfer system can include a phase locked loop; and an interpolation block that applies interpolation to a plurality of samples of the in-band communication bitstream to improve timing accuracy at low sampling rates. The phase locked loop can further include a phase detector that computes an error signal from a difference between an instantaneous peak location and an estimated peak location correlated to a symbol in an in-band communication bitstream; a loop filter that selectively receives the error signal; and a voltage controlled oscillator that adjusts its output frequency responsive to an output of the loop filter. The interpolation can be a quadratic interpolation.

The clock recovery system can further include a bit decision block and a multiplexer that cooperate to selectively provide the error signal to the loop filter responsive to detected bits in the in-band communication bitstream. The bit decision block can be responsive to known bits in the in-band communication bitstream, and the known bits can be 1 bits. The multiplexer can receive the error signal at a first input and the error signal plus an offset signal at a second input. The bit decision block can be responsive to known bits in the in-band communication bitstream. The multiplexer and bit decision block and multiplexer can cooperate to provide the error signal to the loop filter responsive to the known bits and to provide the error signal plus the offset signal to the loop filter responsive to bits other than the known bits. The known bits can be 1 bits, and the bits other than the known bits can be 0 bits. The known bits can be 0 bits, and the bits other than the known bits can be 1 bits.

A method for recovering a clock from an in-band communications signal in a wireless power transfer system, performed by a communications module of a wireless power transfer device, can include selectively applying to a phase locked loop an error signal representing a difference between an instantaneous peak location and an estimated peak location correlated to symbol sampling of a bitstream of the in-band communication signal. Selectively applying the error signal to the phase locked loop can include supplying the error signal responsive to known bits in the bitstream. The method can further include quadratically interpolating a plurality of samples of the bitstream to improve timing accuracy at low sampling rates.

DETAILED DESCRIPTION

Figure 1:
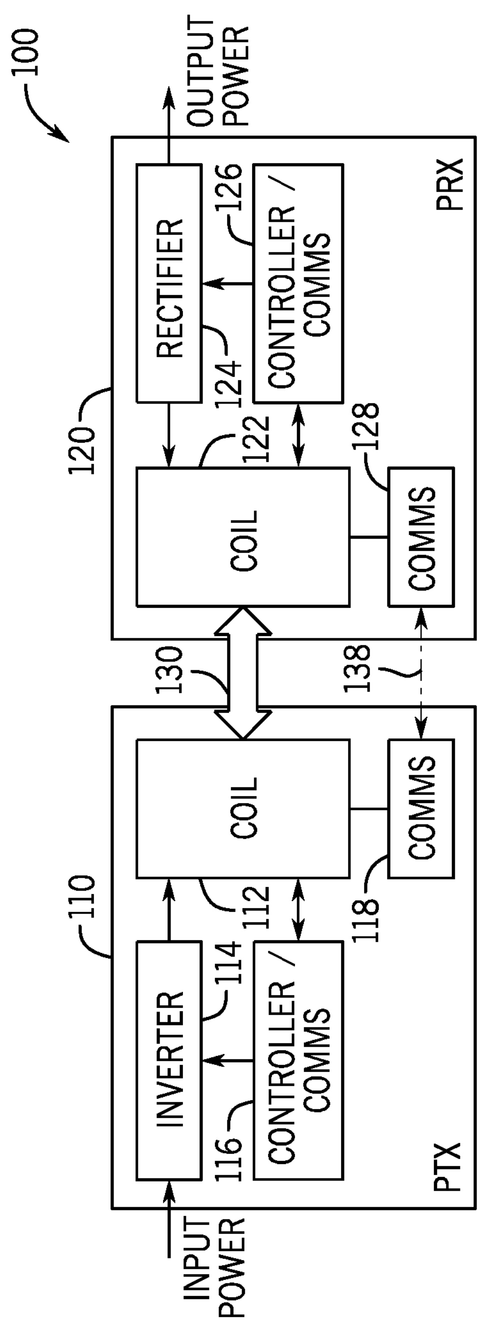
FIG. 1 illustrates a simplified block diagram of a wireless power transfer system.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth to provide a thorough understanding of the implementations described herein. In other instances, methods, procedures, and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

FIG. 1 illustrates a simplified block diagram of a wireless power transfer system 100. Wireless power transfer system includes a power transmitter (PTx) 110 that transfers power to a power receiver (PRx) 120 wirelessly, such as via inductive coupling 130. Power transmitter 110 may receive input power that is converted to an AC voltage having particular voltage and frequency characteristics by an inverter 114. Inverter 114 may be controlled by a controller/communications module 116 that operates as further described below. In various embodiments, the inverter controller and communications module may be implemented in a common system, such as a system based on a microprocessor, microcontroller, or the like. In other embodiments, the inverter controller may be implemented by a separate controller module and communications module that have a means of communication between them. Inverter 114 may be constructed using any suitable circuit topology (e.g., full bridge, half bridge, etc.) and may be implemented using any suitable semiconductor switching device technology (e.g., MOSFETs, IGBTs, etc. made using silicon, silicon carbide, or gallium nitride devices).

Inverter 114 may deliver the generated AC voltage to a transmitter coil 112. In addition to a wireless coil allowing magnetic coupling to the receiver, the transmitter coil block 112 illustrated in FIG. 1 may include tuning circuitry, such as additional inductors and capacitors, that facilitate operation of the transmitter in different conditions, such as different degrees of magnetic coupling to the receiver, different operating frequencies, etc. The wireless coil itself may be constructed in a variety of different ways. In some embodiments, the wireless coil may be formed as a winding of wire around a suitable bobbin. In other embodiments, the wireless coil may be formed as traces on a printed circuit board. Other arrangements are also possible and may be used in conjunction with the various embodiments described herein. The wireless transmitter coil may also include a core of magnetically permeable material (e.g., ferrite) configured to affect the flux pattern of the coil in a way suitable to the particular application. The teachings herein may be applied in conjunction with any of a wide variety of transmitter coil arrangements appropriate to a given application.

PTx controller/communications module 116 may monitor the transmitter coil and use information derived therefrom to control the inverter 114 as appropriate for a given situation. For example, controller/communications module may be configured to cause inverter 114 to operate at a given frequency or output voltage depending on the particular application. In some embodiments, the controller/communications module may be configured to receive information from the PRx device and control inverter 114 accordingly. This information may be received via the power transmission coils (i.e., in-band communication) or may be received via a separate communications channel (not shown, i.e., out-of-band communication). For in-band communication, controller/communications module 116 may detect and decode signals imposed on the magnetic link (such as voltage, frequency, or load variations) by the PRx to receive information and may instruct the inverter to modulate the delivered power by manipulating various parameters of the generated voltage (such as voltage, frequency, etc.) to send information to the PRx. In some embodiments, controller/communications module may be configured to employ frequency shift keying (FSK) communications, in which the frequency of the inverter signal is modulated, to communicate data to the PRx. Controller/communications module 116 may be configured to detect amplitude shift keying (ASK) communications or load modulation-based communications from the PRx. In either case, the controller/communications module 126 may be configured to vary the current drawn on the receiver side to manipulate the waveform seen on the Tx coil to deliver information from the PRx to the PTx. For out-of-band communication, additional modules that allow for communication between the PTx and PRx may be provided, for example, WiFi, Bluetooth, or other radio links or any other suitable communications channel.

As mentioned above, controller/communications module 116 may be a single module, for example, provided on a single integrated circuit, or may be constructed from multiple modules/devices provided on different integrated circuits or a combination of integrated and discrete circuits having both analog and digital components. The teachings herein are not limited to any particular arrangement of the controller/communications circuitry.

PTx device 110 may optionally include other systems and components, such as a separate communications ("comms") module 118. In some embodiments, comms module 118 may communicate with a corresponding module in the PRx via the power transfer coils. In other embodiments, comms module 118 may communicate with a corresponding module using a separate physical channel 138. Communications functions described herein may be implemented using a communications module that is part of a combined controller/communications module 116 as described above or a separate comms module 118.

As noted above, wireless power transfer system also includes a wireless power receiver (PRx) 120. Wireless power receiver can include a receiver coil 122 that may be magnetically coupled 130 to the transmitter coil 112. As with transmitter coil 112 discussed above, receiver coil block 122 illustrated in FIG. 1 may include tuning circuitry, such as additional inductors and capacitors, that facilitate operation of the transmitter in different conditions, such as different degrees of magnetic coupling to the receiver, different operating frequencies, etc. The wireless coil itself may be constructed in a variety of different ways. In some embodiments, the wireless coil may be formed as a winding of wire around a suitable bobbin. In other embodiments, the wireless coil may be formed as traces on a printed circuit board. Other arrangements are also possible and may be used in conjunction with the various embodiments described herein. The wireless receiver coil may also include a core of magnetically permeable material (e.g., ferrite) configured to affect the flux pattern of the coil in a way suitable to the particular application. The teachings herein may be applied in conjunction with any of a wide variety of receiver coil arrangements appropriate to a given application.

Receiver coil 122 outputs an AC voltage induced therein by magnetic induction via transmitter coil 112. This output AC voltage may be provided to a rectifier 124 that provides a DC output power to one or more loads associated with the PRx device. Rectifier 124 may be controlled by a controller/communications module 126 that operates as further described below. In various embodiments, the rectifier controller and communications module may be implemented in a common system, such as a system based on a microprocessor, microcontroller, or the like. In other embodiments, the rectifier controller may be implemented by a separate controller module and communications module that have a means of communication between them. Rectifier 124 may be constructed using any suitable circuit topology (e.g., full bridge, half bridge, etc.) and may be implemented using any suitable semiconductor switching device technology (e.g., MOSFETs, IGBTs, etc. made using silicon, silicon carbide, or gallium nitride devices).

PRx controller/communications module 126 may monitor the receiver coil and use information derived therefrom to control the rectifier 124 as appropriate for a given situation. For example, controller/communications module may be configured to cause rectifier 124 to operate provide a given output voltage depending on the particular application. In some embodiments, the controller/communications module may be configured to send information to the PTx device to effectively control the power delivered to the receiver. This information may be received sent via the power transmission coils (i.e., in-band communication) or may be sent via a separate communications channel (not shown, i.e., out-of-band communication). For in-band communication, controller/communications module 126 may, for example, modulate load current or other electrical parameters of the received power to send information to the PTx. In some embodiments, controller/communications module 126 may be configured to detect and decode signals imposed on the magnetic link (such as voltage, frequency, or load variations) by the PTx to receive information from the PTx. In some embodiments, controller/communications module 126 may be configured to receive frequency shift keying (FSK) communications, in which the frequency of the inverter signal has been modulated to communicate data to the PRx. Controller/communications module 126 may be configured to generate amplitude shift keying (ASK) communications or load modulation-based communications from the PRx. In either case, the controller/communications module 126 may be configured to vary the current drawn on the receiver side to manipulate the waveform seen on the Tx coil to deliver information from the PRx to the PTx. For out-of-band communication, additional modules that allow for communication between the PTx and PRx may be provided, for example, WiFi, Bluetooth, or other radio links or any other suitable communications channel.

As mentioned above, controller/communications module 126 may be a single module, for example, provided on a single integrated circuit, or may be constructed from multiple modules/devices provided on different integrated circuits or a combination of integrated and discrete circuits having both analog and digital components. The teachings herein are not limited to any particular arrangement of the controller/communications circuitry. PRx device 120 may optionally include other systems and components, such as a comms module 128. In some embodiments, comms module 128 may communicate with a corresponding module in the PTx via the power transfer coils. In other embodiments, comms module 128 may communicate with a corresponding module or tag using a separate physical channel 138. Communications functions described herein may be implemented using a communications module that is part of a combined controller/communications module 126 as described above or a separate comms module 128.

Numerous variations and enhancements of the above-described wireless power transmission system 100 are possible, and the following teachings are applicable to any of such variations and enhancements.

In-band communications channels, as described above, may be implemented in various ways. As one example, a PRx device 120, using its associated comms module 128 may transmit information to PTx device 110 and its comms module 118, using ASK (amplitude shift keying) modulation of the received power/current. In some implementations, these ASK communications may occur at a relatively low data rate, e.g., on the order of 1-2 kbps. In some implementations, higher data rates, e.g., on the order of 20 kbps may be desired. When going from relatively lower data rate/frequency communications to relatively higher data rates/communications, certain properties of the physical channel (i.e., the inductive link) may pose issues with respect to the communication.

Figure 2:
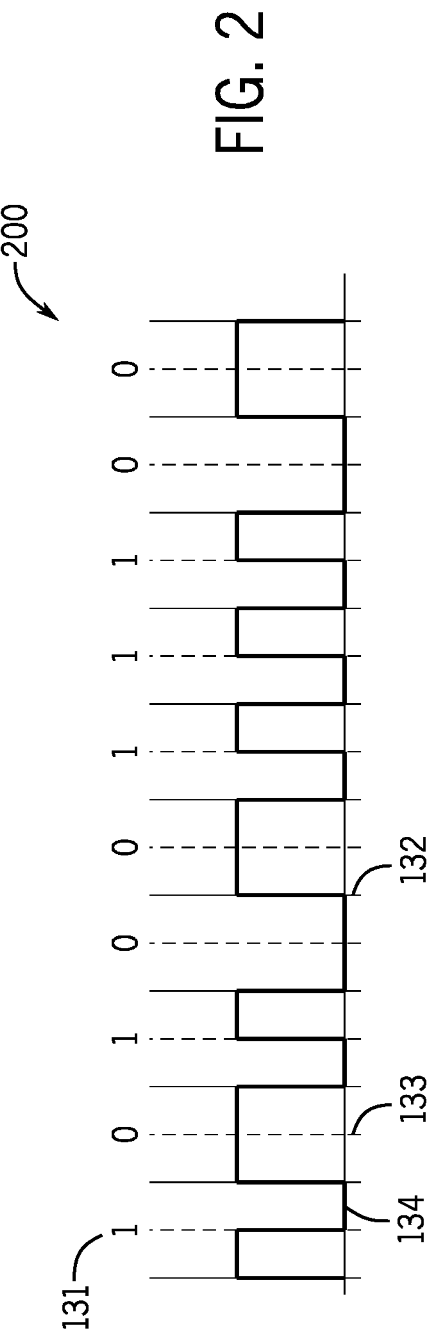
FIG. 2 illustrates an encoding scheme for communication from a wireless power receiver (PRx) to a wireless power transmitter (PTx).

More specifically, FIG. 2 illustrates a Manchester/bi-phase encoding scheme 200 for communication from a wireless power receiver (PRx) to a wireless power transmitter (PTx). In encoding scheme 200, each bit period can include a single digital value 131, which can be either a "1" or a "0". The beginning of each bit period, delineated by solid vertical lines 132, will include a transition from low to high or vice-versa, regardless of the preceding bit value and/or following bit value. A 0 bit can be encoded using only this start of bit transition, while a 1 bit can be encoded by an additional transition at the middle of the bit period, which is denoted by dashed lines 133. Thus, a 0 bit will have only the start of bit transition, while a 1 bit will have the start of bit transition and an additional mid-bit transition, as illustrated in FIG. 2. Thus the "1010011100" bit sequence illustrated in FIG. 2 can be encoded by the waveform 134 including transitions as described above. this waveform can be applied to modulate the load current/power received by PRx 120 to communicate information back to PTx 110.

Applying the above-described encoding scheme would produce a square wave having a frequency equal to the data rate for a stream of all 1 bits, and a square wave having one-half the sample rate for a stream of all 0 bits. Thus, for a 2 kbps data rate, a stream of all 1s would produce something resembling a 2 kHz square wave, while a stream of all 0s would produce something resembling a 1 kHz square wave. Similarly, for a 20 kbps data rate a stream of all 1s would produce something resembling a 20 kHz square wave, while a stream of all 0s would produce something resembling a 10 kHz square wave. The inductive link between PTx 110 and PRx 120, which is the physical channel for these communication signals, can be characterized as a low pass filter. In the case of lower data rates, the difference between 1 bits and 0 bits may not be materially altered by the physical channel. However, the same may not be true in the case of higher data rates, where the low-pass nature of the physical channel can result in significant differences in both the gain and phase of the respective symbols. For example, the higher frequency content associated with the 1 bits may result in a lower amplitude and a phase shift with respect to the 0 bits.

This difference as between symbols can affect communication, including clock recovery. More specifically, the PTx 110 (e.g. via its comms module 118) may have a clock signal for decoding the received data stream. However, this clock may have a relatively large tolerance (e.g., +/−3%) that can cause issues if it is sufficiently different from and/or drifting relative to the clock signal used by PRx 120 (and its comms module 128) to generate the data stream. Based on the exemplary 3% tolerance, a 20 kbps data rate may actually be between 19.4 to 20.6 kbps. As divergence of the respective transmitter and receiver clocks can make successfully decoding the communications impossible, a method by which the PTx 120/comms module 118 can recover the clock from the received data signal is desirable. One technique for doing so can include the use of a phase locked loop (PLL).

Figure 3:
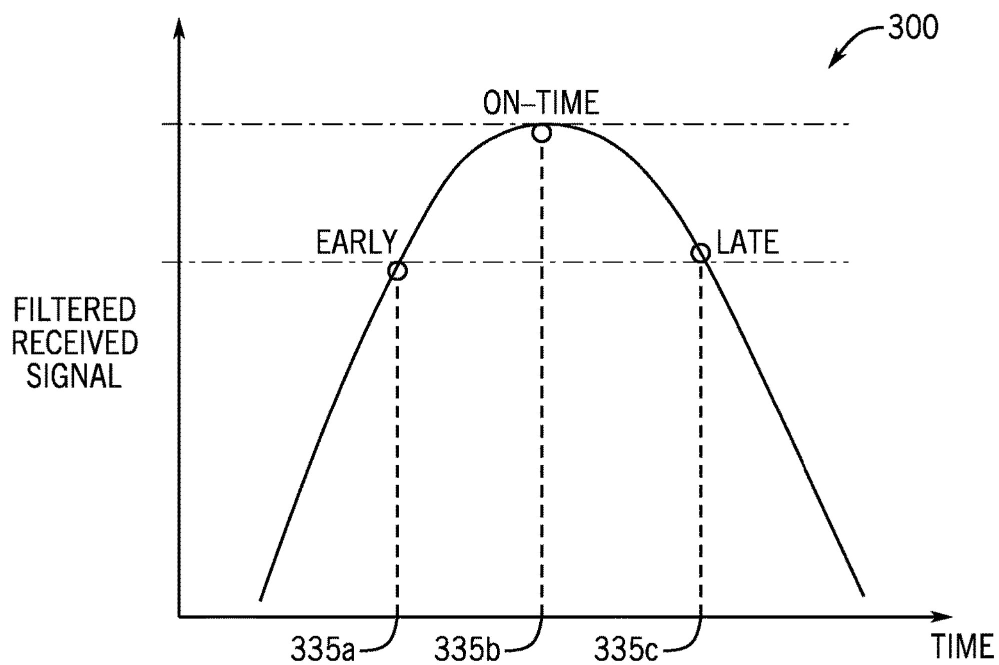
FIG. 3 conceptually illustrates a correlator for recovering ASK/Manchester encoded communications from wireless power receiver to wireless power transmitter.

FIG. 3 conceptually illustrates recovering ASK/Manchester encoded communications from wireless power receiver to wireless power transmitter. FIG. 3 includes a plot 300 showing a single half-cycle of a sine wave corresponding to a filtered correlator output signal. Low pass filtering a square wave can produce a generally sinusoidal signal. Correlator circuitry can be implemented using any suitable combination of analog, digital, and/or programmable circuitry and can be part of the comms module 118 of PTx device 110. Although illustrated as a continuous waveform, the received signal is actually a sequence of samples. The sample rate may vary although it must generally be somewhat higher than the data rate. For example, for a 20 kpbs data rate, a sample rate on the order of 200 kS/s (kilo-samples per second) can result in about 10 samples per bit period. These 10 samples can then be analyzed to detect the peak value. This peak can be detected on time 335*b*, meaning that the actual timing of the peak and the detected timing of the peak correspond. Alternatively, the peak can be detected early 335a, meaning that the actual timing of the peak is later than the detected timing of the peak; or the peak can be detected late 335c, meaning that the actual timing of the peak is earlier than the detected timing of the peak. In either of the latter two cases, the detected value will be lower than the actual peak value, resulting in a lower signal to noise ratio (SNR). To overcome this, a phase locked loop (PLL) can be used to compensate for the error in peak detection (either early or late) and adjust the clock signal accordingly to keep in phase with the received signal.

Figure 4:
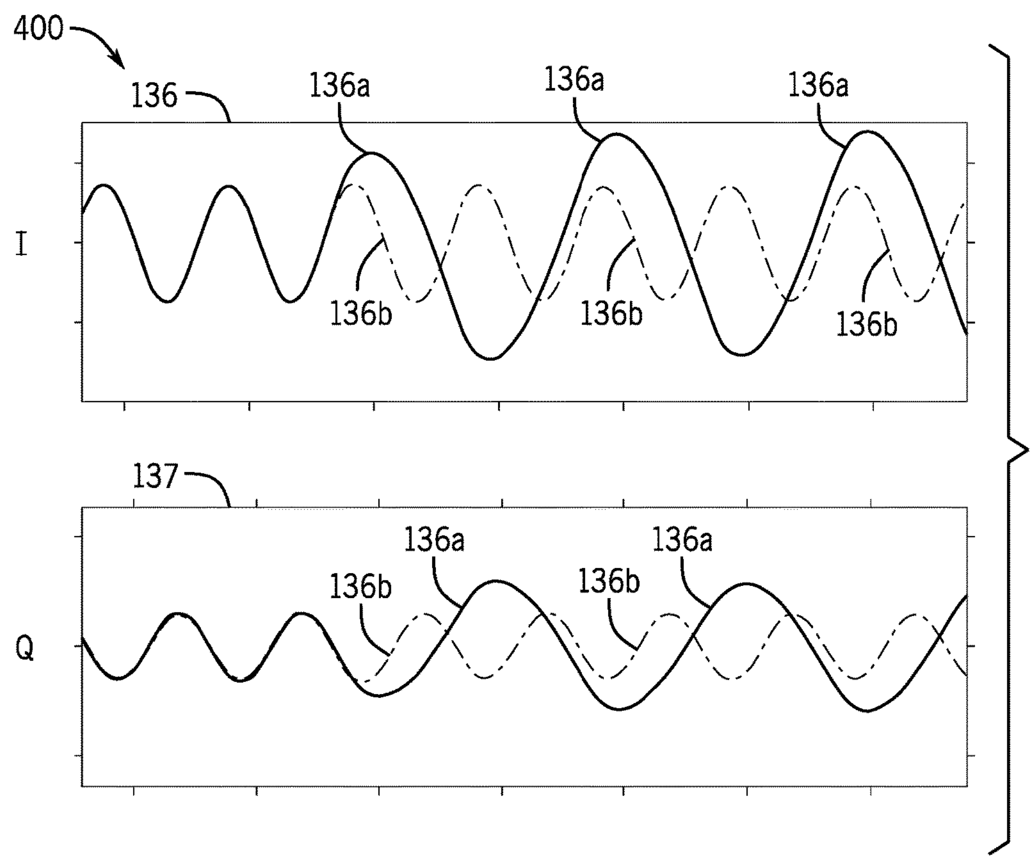
FIG. 4 illustrates correlator output illustrating the differences between "1s" and "0s" encoded as described above with respect to FIG. 2.

However, as noted above, the phase effects of the inductive power transfer channel can cause the peaks associated with 0 bits to be offset from peaks associated with the 1 bits. FIG. 4 illustrates correlator output 400 illustrating the differences between "1s" and "0s" encoded as described above with respect to FIG. 2. Specifically, the received signal can be subjected to I-Q decomposition, which can produce an I-component 136 and a Q component 137. Because the inductive power transfer channel exhibits low-pass characteristics such as lower gain at higher frequencies, and the encoded 1 bits include higher frequency components, the 1 bits are associated with smaller peaks 136*b*, while the 0 bits are associated with larger peaks 136*a*. Additionally, there can also be a phase shift between the peaks associated with 1 bits (136*b*) and peaks associated with 0 bits (136*a*). In a bitstream containing an arbitrary sequence of 1 bits and 0 bits, this difference in phase between the respective peaks can pose difficulties for a PLL used as part of the clock recovery process. In some cases, the PLL may not be able to keep synchronization, and successful decoding of the communications may become impossible. To overcome this issue, one or more of the following modified PLL implementations may be employed. Each of these modifications can take advantage of known characteristics of the bitstream, as described in greater detail below.

Figure 5:
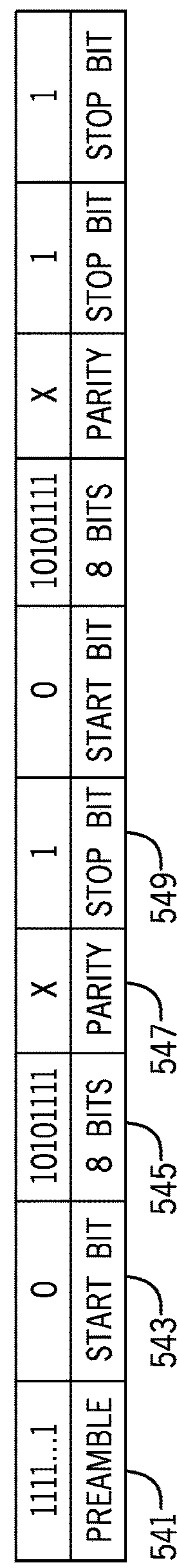
FIG. 5 illustrates an exemplary bitstream for communications from PRx to PTx.

FIG. 5 illustrates an exemplary bitstream 500 for communications from PRx to PTx. Such a bitstream may be specified in a standard, such as the Qi wireless power transfer standard(s) promulgated by the Wireless Power Consortium. In other cases, devices may implement a bitstream syntax according to an alternative specification, which may be an industry standard or a proprietary protocol definition. For purposes of the following discussion, the bitstream format of FIG. 5, which is specified in the Qi standard, will be used. As illustrated in FIG. 5, the bitstream 500 can include a preamble 541 followed by a series of packets. Each packet can include a start bit 543, a payload 545 (in this case 8 bits), a parity bit 547, and a stop bit 549. In the illustrated example, the preamble 541 is a sequence of 1 bits, e.g., eleven consecutive 1 bits. The start bit can be defined to be zero, as specified in the Qi standard. The payload 545 can be an arbitrary sequence of 8 bits. The following parity bit 547 can be determined based on the value of the preceding 8 bits and can be used to detect a transmission or decoding error. Finally, the stop bit 549 can be defined to always be 1. Thus, for every packet of eleven bits, there will be a known start bit of zero, nine arbitrary bits (i.e., eight data bits and one parity bit), and a stop bit of 1. These known characteristics of the bitstream can be used to enhance performance of a PLL in various ways described below.

Figure 6:
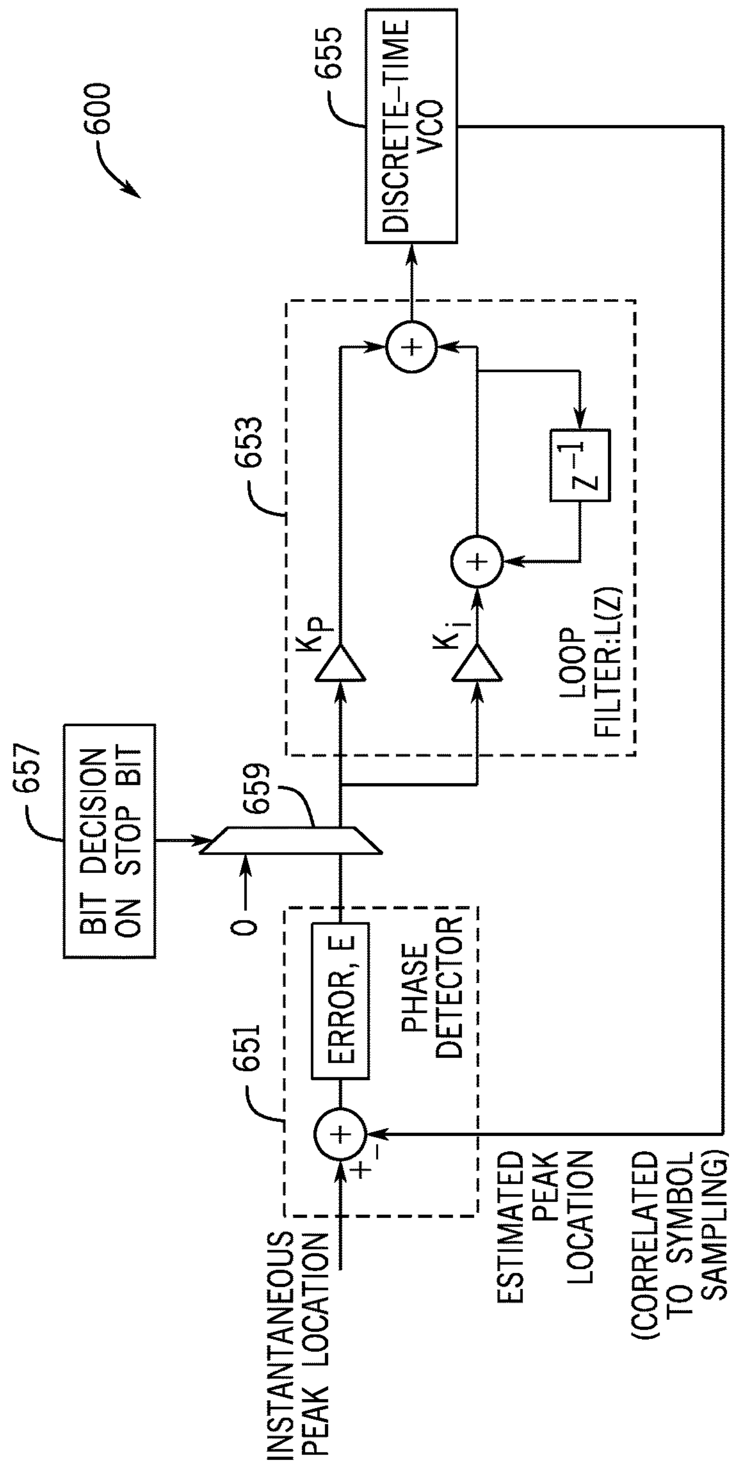
FIG. 6 illustrates an improved clock recovery scheme using a stop bit tracking PLL.

FIG. 6 illustrates an improved clock recovery scheme using a stop bit tracking PLL 600. Stop bit tracking PLL 600 can include a phase detector 651. Phase detector 651 can receive at one input an instantaneous peak location. Phase detector 651 can also receive at a second input an estimated peak location correlated to symbol sampling. The difference between these two can be an error signal e. In a conventional PLL, the error signal e can be provided to a loop filter 653, with the output of loop filter 653 being provided to a voltage controlled oscillator (VCO) 655, whose output frequency is controlled by the output voltage of loop filter 653. In the embodiments illustrated herein, the VCOs are implemented as discrete-time VCOs, although the principles described herein would also be applicable to other VCO types. Implementation of such phase locked loops, filters, and VCOs, in the analog, digital, and/or hybrid domains are known to those skilled in the art, and thus will not be repeated here.

Stop bit tracking PLL 600 differs from a conventional PLL in that the error signal from phase detector 651 is only intermittently or periodically applied to the loop filter 653. More specifically, the error signal e that is the output of phase detector 651 can be provided to one input of a multiplexer 659. A zero value can be provided to another input of multiplexer 659. Multiplexer 659 can be controlled by stop bit decision block 657. Stop bit decision block 657 can be implemented using digital and/or programmable circuitry that monitors the received and decoded bitstream. For example, stop bit decision block 657 could be implemented as part of the comms module 118 for PTx device 110. Stop bit detection block 657 can monitor the decoded bitstream to determine when a stop bit 549 is detected and trigger multiplexer 659 to toggle its output from the zero value at its first input to the error signal at its second input. The effect of this configuration is that the error signal from phase detector 651 will trigger an adjustment of the PLL clock output from VCO 655 only on the stop bits 549. As described above, the stop bits 549 always have a value of 1. Thus, the PLL will only be responding to error signals associated with a 1 bit, so the relative phase offset between 1 and 0 bits will not adversely affect PLL tracking.

The system described above with reference to FIG. 6 could be modified to adjust the PLL only on 0 bits, rather than only 1 bits. For example, the known start bit 543 illustrated in FIG. 5 could be detected by a start bit decision block in place of stop bit decision block 657. In the coding scheme described above, tracking on 1 bits may be more advantageous because the increased gain of 0 bits due to their lower frequency content and the low pass effects of the inductive power channel results in the 0 bits having a higher signal to noise ratio. Thus, any phase tracking errors associated with peak detection for the 0 bits based on feedback to the PLL from the 1 bits will be less likely to cause decoding errors than the reverse. However, for different encoding schemes than that described with reference to FIG. 2 and/or for systems in which the communication channel exhibits different characteristics, a zero tracking configuration may be preferred.

Figure 7:
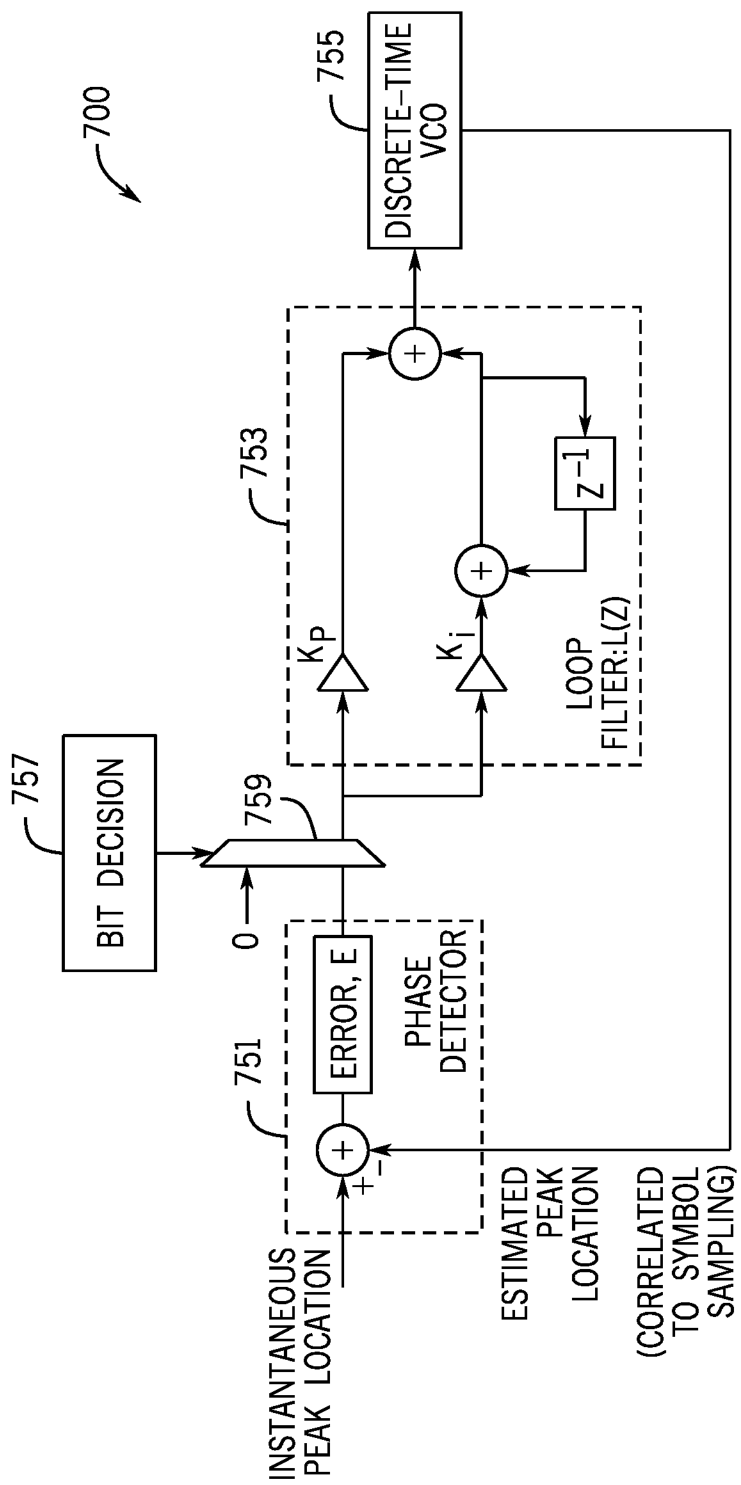
FIG. 7 illustrates an improved clock recovery scheme using "1" bit tracking with a decision directed PLL.

FIG. 7 illustrates an improved clock recovery scheme using "1" bit tracking with a decision directed PLL 700. Decision directed PLL 700 can include a phase detector 751. Phase detector 751 can receive at one input an instantaneous peak location. Phase detector 751 can also receive at a second input an estimated peak location correlated to symbol sampling. The difference between these two can be an error signal e. In a conventional PLL, the error signal e can be provided to a loop filter 753, with the output of loop filter 753 being provided to a voltage controlled oscillator (VCO) 755, whose output frequency is controlled by the output voltage of loop filter 753. In the embodiments illustrated herein, the VCOs are implemented as discrete-time VOCs, although the principles described herein would also be applicable to other VCO types. Implementation of such phase locked loops, filters, and VCOs, in the analog, digital, and/or hybrid domains are known to those skilled in the art, and thus will not be repeated here.

Decision directed PLL 700 differs from a conventional PLL in that the error signal from phase detector 751 is only intermittently or periodically applied to the loop filter 753. More specifically, the error signal e that is the output of phase detector 751 can be provided to one input of a multiplexer 759. A zero value can be provided to another input of multiplexer 759. Multiplexer 759 can be controlled by bit decision block 757. Bit decision block 757 can be implemented using digital and/or programmable circuitry that monitors the received and decoded bitstream. For example, bit decision block 757 could be implemented as part of the comms module 118 for PTx device 110. Bit decision block 757 can monitor the decoded bitstream to determine when any 1 bit is detected and trigger multiplexer 759 to toggle its output from the zero value at its first input to the error signal at its second input. The effect of this configuration is that the error signal from phase detector 751 will trigger an adjustment of the PLL clock output from VCO 755 on all 1 bits, not just stop bit 549 as in the embodiment described above. Thus, the PLL will only be responding to error signals associated with a 1 bit, so the relative phase offset between 1 and 0 bits will not adversely affect PLL tracking, but the increased frequency of 1 bits versus just stop bits can allow the PLL to have improved tracing relative to the embodiment described above. This may come at the cost of increased complexity for bit decision block 757 as opposed to stop bit detector, in that 1 bits can be detected, rather just stop bits at packet boundaries.

As with the embodiment of FIG. 6, the system described above with reference to FIG. 7 could be modified to adjust the PLL only on 0 bits, rather than only 1 bits, which might be advantageous in systems having different encoding schemes, packet structures, and/or channel characteristics.

Figure 8A:
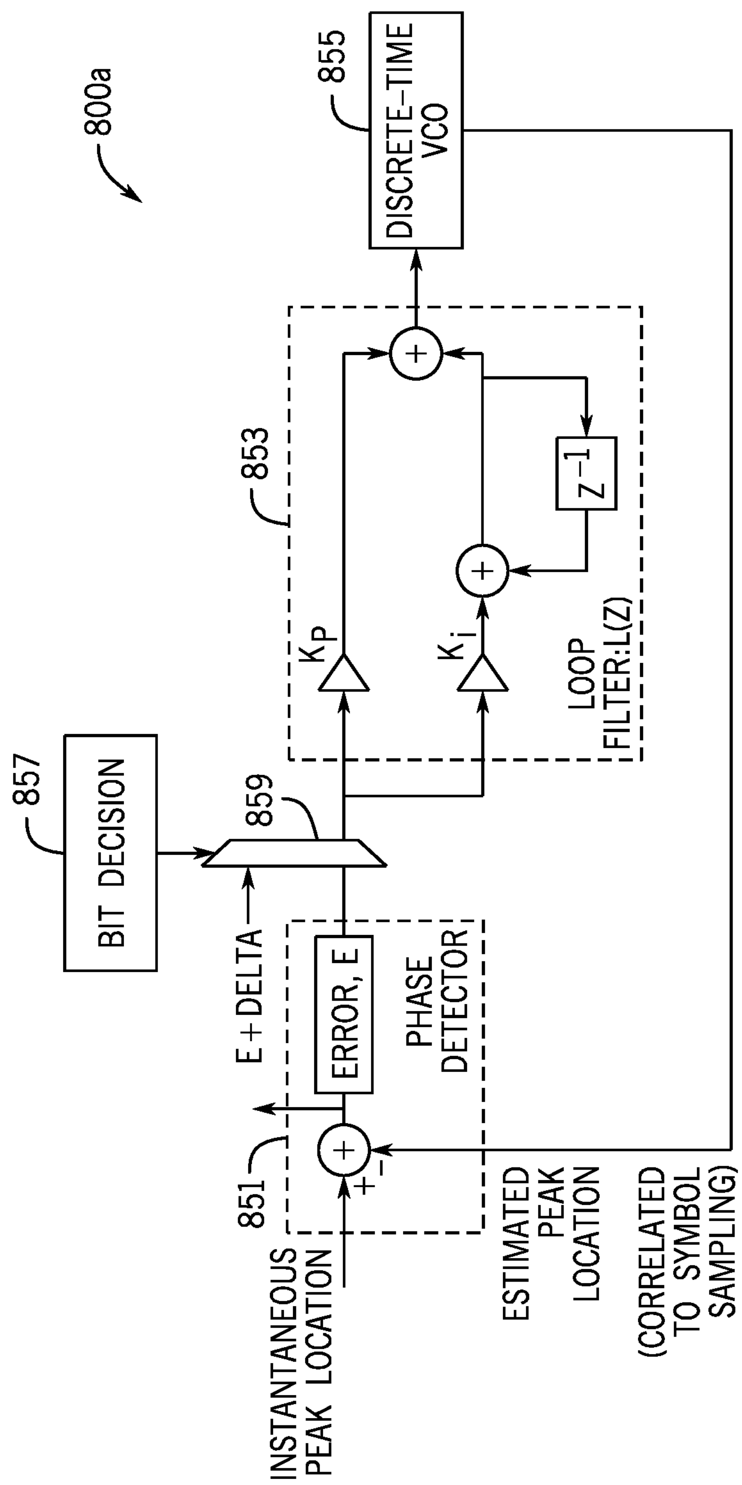
FIGS. 8A-8B illustrate an improved clock recovery scheme using "1" bit tracking with a decision directed PLL with offset tracking.
Figure 8B:
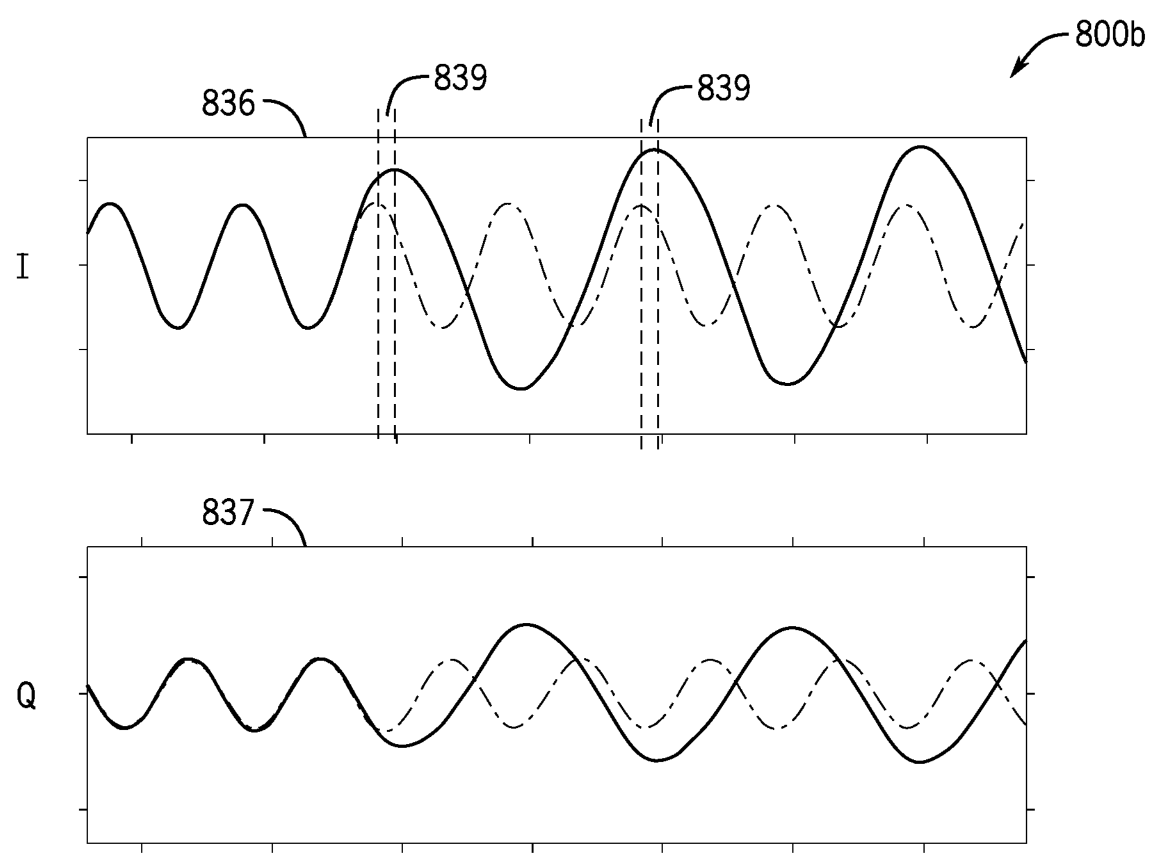

FIGS. 8A-8B illustrate an improved clock recovery scheme using "1" bit tracking with a decision directed PLL with offset tracking. FIG. 8A illustrates a block diagram of the modified decision directed/offset tracking PLL 800*a*. FIG. 8B illustrates the offset tracking feature for tracking the offset between 1 bits and 0 bits. Decision directed/offset tracking PLL 800*a* can include a phase detector 851. Phase detector 851 can receive at one input an instantaneous peak location. Phase detector 851 can also receive at a second input an estimated peak location correlated to symbol sampling. The difference between these two can be an error signal e. In a conventional PLL, the error signal e can be provided to a loop filter 853, with the output of loop filter 853 being provided to a voltage controlled oscillator (VCO) 855, whose output frequency is controlled by the output voltage of loop filter 853. In the embodiments illustrated herein, the VCOs are implemented as discrete-time VOCs, although the principles described herein would also be applicable to other VCO types. Implementation of such phase locked loops, filters, and VCOs, in the analog, digital, and/or hybrid domains are known to those skilled in the art, and thus will not be repeated here. Decision directed/offset tracking PLL 800*a* differs from a conventional PLL in that the error signal from phase detector 851 is only intermittently or periodically applied to the loop filter 853. More specifically, the error signal e that is the output of phase detector 851 can be provided to one input of a multiplexer 859. A delta value e+ delta can be provided to another input of multiplexer 859. This delta value can be the determined phase offset between 1 bits and 0 bits, which can be determined as described below. Multiplexer 859 can be controlled by bit decision block 857. Bit decision block 857 can be implemented using digital and/or programmable circuitry that monitors the received and decoded bitstream. For example, bit decision block 857 could be implemented as part of the comms module 118 for PTx device 110. bit decision block 857 can monitor the decoded bitstream to determine when any 1 bit is detected and trigger multiplexer 859 to toggle its output from the zero value at its first input to the error signal at its second input. The effect of this configuration is that the error signal from phase detector 851 will trigger an adjustment of the PLL clock output from VCO 755 based on the error signal e from phase detector 851 on all 1 bits. Likewise, zero bits will trigger an adjustment of the PLL clock output based on the e+ delta/offset error signal. Thus, the PLL will only be responding to error signals associated with both 1 bits and 0 bits, with the offset accounted for, so that the relative phase offset between 1 and 0 bits will not adversely affect PLL tracking. This configuration, too, can allow for improved PLL tracking, at the expense of increased complexity of bit decision block 857.

As noted above, decision directed/offset tracking PLL **800*a* can determine the offset 839 between 0 bits and 1 bits, as illustrated in FIG. 8B. FIG. 8B include a plot 800*b* of the I-Q signals corresponding to the output of the correlator as discussed above with reference to FIG. 4. Plot 836 represents the "I" signal and plot 837 represents the "Q" signal. One bits are represented by the lower amplitude/higher frequency sine waves, and 0 bits are represented by the higher amplitude/lower frequency sine waves. As noted above, the offset 839 between peaks of 1 bits and 0 bits can be learned by the system. One way to achieve this is to use known characteristics of the bitstream to measure/learn the offset 839 between 0 bits and 1 bits. For example, using the bitstream format depicted in FIG. 5 and described above, it can be known that a start bit 543 will always be a 0 bit followed by a 1 bit (or a string of 1 bits) from preamble 541. Similarly, for subsequent packets, a start bit with a value of 0 will always follow a stop bit with a value of 1. These known characteristics of the bit stream can be used to identify the phase offset between 1 bits and 0 bits which can be provided to multiplexer 859 and selectively supplied to loop filter 853** as described above. In an alternative embodiment, the bitstream structure/syntax could be modified such that the preamble sequence, rather than being all 1 bits as illustrated, could be alternating 1 and 0 bits. Thus, the preamble itself could be used for offset learning.

As with the embodiment of FIG. 6, the system described above with reference to FIG. 7 could be modified to adjust the PLL only on 0 bits, rather than only 1 bits, which might be advantageous in systems having different encoding schemes, packet structures, and/or channel characteristics. Such a system might be useful in high signal to noise ratio regimes. In such a case, bit decision block 857 and multiplexer could operate in a way opposite that described above with respect to bit decision block 757, i.e., the bit decision block 857 could detect zero bits and apply the detected offset in such cases, while applying either no offset or a pre-learned offset in response to 1 bits.

In some applications, a bit decision block and multiplexer could be configured to provide adaptive operation depending on channel conditions, etc. For example, a programmable bit decision block could be provided that was selectively configurable to detect stop bits, start bits, all 1 bits, all 0 bits, or discriminate between 1 and 0 bits. Such a configurable bit decision block could selectively trigger a multiplexer that received an offset measurement from a phase detector and also an additional offset value and/or a zero error value. The configurable bit decision block could cause the multiplexer to selectively apply the measured error, a predetermined offset error, and/or a zero error signal to cause the loop filter to track on any of these values. Thus, optimized offset error correction can be applied regardless of operating conditions.

Figure 9A:
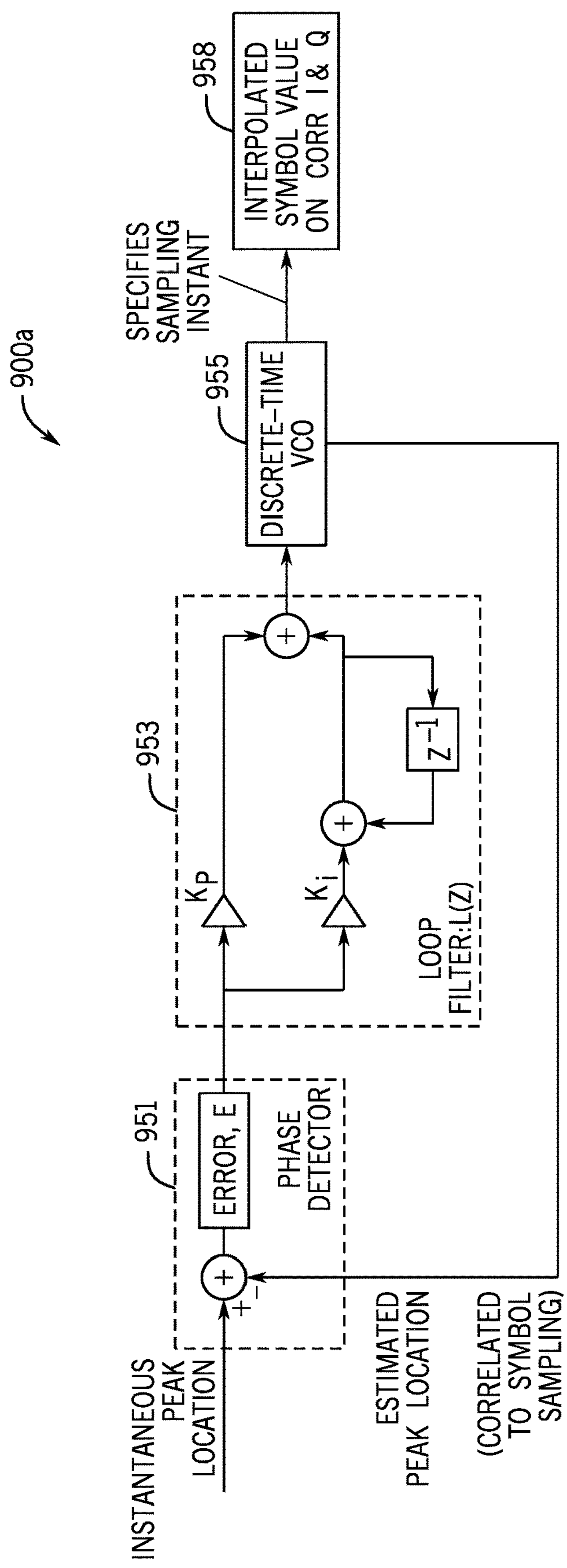
FIGS. 9A-9B illustrate an improved clock recovery scheme using quadratic interpolation.
Figure 9B:
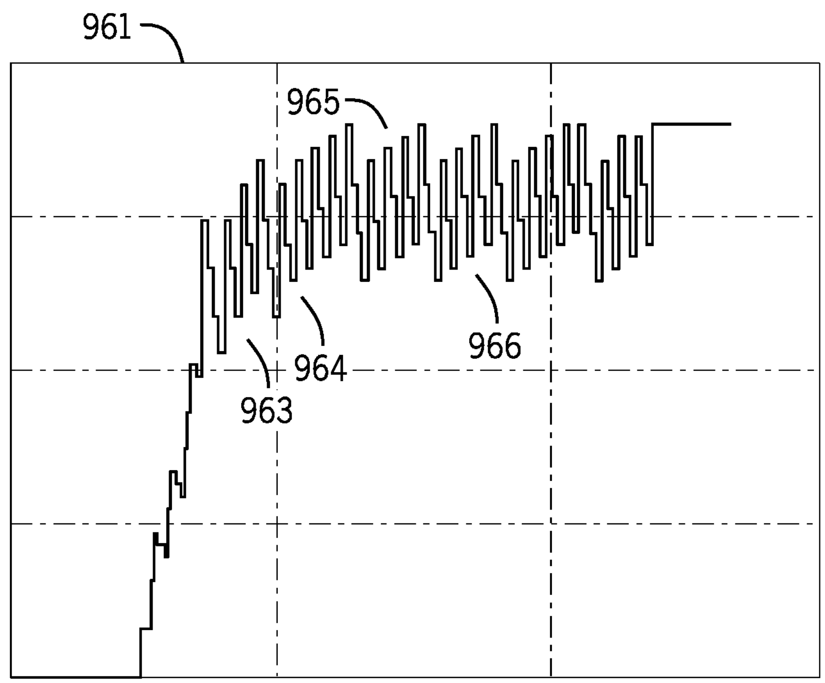
Figure 9B:
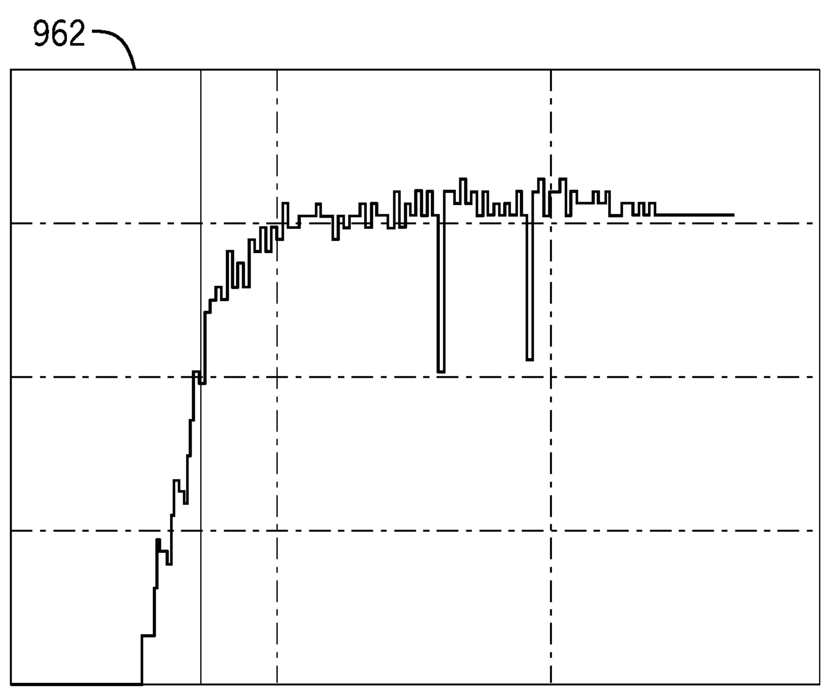

FIGS. 9A-9B illustrate an improved clock recovery scheme using quadratic interpolation. In addition to the phase offset issues described above, another clock recovery issue that can occur in wireless power transfer systems relates to limited sampling rates. The primary function of a wireless power transfer system is the delivery of power. In-band communication between PRx and PTx is a necessary, but ancillary function. Thus, in many applications, it may be desirable to limit things like the PTx communication module's sampling rate of the received in-band comms signal to reduce power consumption both for the sampling but also the subsequent processing of the sampled data. However, such a reduced sampling rate may make it more difficult to successfully recover the unknown timing of the bitstream received from the PRx. One way to address this issue is to provide a quadratic interpolation of received samples. This quadratic interpolation can be applied independently of or in conjunction with any of the above-described phase offset compensation techniques.

FIG. 9A illustrates a PLL **900*a* for use with an interpolation scheme. Interpolating PLL 900*a* can include a phase detector 951. Phase detector 951 can receive at one input an instantaneous peak location. Phase detector 951 can also receive at a second input an estimated peak location correlated to symbol sampling. The difference between these two can be an error signal e. As in a conventional PLL, the error signal e can be provided to a loop filter 953, with the output of loop filter 953 being provided to a voltage controlled oscillator (VCO) 955, whose output frequency is controlled by the output voltage of loop filter 953. In the embodiments illustrated herein, the VCOs are implemented as discrete-time VCOs, although the principles described herein would also be applicable to other VCO types. Implementation of such phase locked loops, filters, and VCOs, in the analog, digital, and/or hybrid domains are known to those skilled in the art, and thus will not be repeated here. In any case, the output of VCO 955** can be used to specify the sampling instant of the interpolated symbol value from the correlator as described above.

In some embodiments, quadratic interpolation may be employed. That is, three sample points can have a quadratic curve fit thereto using known analytic techniques. More specifically, the generic quadratic form is $y=ax^2+bx+c$. By plugging in three sample values and their sample times, the resulting system of three equations can be used to solve for the three coefficients a, b, and c. Quadratic interpolation has been observed by the inventors to provide a good balance between computational tractability/performance and accuracy. However, in some applications, interpolation using lower order (e.g., linear) or higher order (cubic, quartic, etc.) polynomials may be employed. Likewise, fits other than polynomial curves may be appropriate in some instances.

The quantization problem caused by the low sampling rate and can be understood with reference to FIG. 9B, which represents a PLL tracking curves 961, without interpolation, and 962, with interpolation. Using the example bitrate of 20 kbps and sample rate of 200 ksamples/sec described above, a nominal sample rate of 10 bits per sample is expected. However, because of timing tolerance/error, deviations between the measured and actual rate will vary. For example, if the sample clock and bitstream clock deviation is such that there are 10.2 samples per bit on average, there may be a sequence of four bits having 10 samples followed by a bit with 11 samples. This can manifest itself as jumps in tracking illustrated in plot 961 of FIG. 9B, with the symbol exhibiting periodic jumps 963, 964, 965, 966. This results in what is effectively a "jitter" of the sampling time. Conversely, by applying the above-described interpolation, smoother tracking as illustrated in plot 962 can be achieved.

Described above are various features and embodiments relating to timing recovery in wireless power transfer systems. Such arrangements may be used in a variety of applications but may be particularly advantageous when used in conjunction with electronic devices such as mobile phones, tablet computers, laptop or notebook computers, and accessories, such as wireless headphones, styluses, etc. Additionally, although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The foregoing describes exemplary embodiments of wireless power transfer systems that are able to transmit certain information amongst the PTx and PRx in the wireless power transfer system. The present disclosure contemplates passage of certain information improves the devices' ability to provide wireless power signals to each other in an efficient manner to facilitate battery charging, such as by providing power feedback control data packets. Entities implementing the present technology should take care to ensure that, to the extent any sensitive information is used in particular implementations, that well-established privacy policies and/or privacy practices are complied with. In particular, such entities would be expected to implement and consistently apply privacy practices that are generally recognized as meeting or exceeding industry or governmental requirements for maintaining the privacy of users. Moreover, implementers should inform users where personally identifiable information is expected to be transmitted in a wireless power transfer system and allow users to "opt in" or "opt out" of participation. For instance, such information may be presented to the user when they place a device onto a power transmitter, if the power transmitter is configured to poll for sensitive information from the power receiver.

Risk can be minimized by limiting the collection of data and deleting data once it is no longer needed. In addition, and when applicable, data de-identification can be used to protect a user's privacy. For example, a device identifier may be partially masked to convey the power characteristics of the device without uniquely identifying the device. De-identification may be facilitated, when appropriate, by removing identifiers, controlling the amount or specificity of data stored (e.g., collecting location data at city level rather than at an address level), controlling how data is stored (e.g., aggregating data across users), and/or other methods such as differential privacy. Robust encryption may also be utilized to reduce the likelihood that communication between inductively coupled devices are spoofed.

What is claimed is:

1. A clock recovery system for recovering an in-band communication clock in a wireless power transfer system, the clock recovery system comprising:
- a phase locked loop comprising:
  - a phase detector that computes an error signal from a difference between an instantaneous peak location and an estimated peak location correlated to a symbol in an in-band communication bitstream;
  - a loop filter that selectively receives the error signal; and
  - a voltage controlled oscillator that adjusts its output frequency responsive to an output of the loop filter; and
- a bit decision block and a multiplexer that cooperate to selectively provide the error signal to the loop filter responsive to detected bits in the in-band communication bitstream.

2. The clock recovery system of claim 1 wherein:
- the multiplexer receives the error signal at a first input and a zero signal at a second input;
- the bit decision block is responsive to known bits in the in-band communication bitstream; and
- the bit decision block and multiplexer cooperate to provide the error signal to the loop filter responsive to the known bits and to provide the zero signal to the loop filter responsive to bits other than the known bits.

3. The clock recovery system of claim 2 wherein the known bits are stop bits.

4. The clock recovery system of claim 2 wherein the known bits are 1 bits.

5. The clock recovery system of claim 2 wherein the known bits are 0 bits.

6. The clock recovery system of claim 1 wherein:
- the multiplexer receives the error signal at a first input and the error signal plus an offset signal at a second input;
- the bit decision block is responsive to known bits in the in-band communication bitstream; and
- the bit decision block and multiplexer cooperate to provide the error signal to the loop filter responsive to the known bits and to provide the error signal plus the offset signal to the loop filter responsive to bits other than the known bits.

7. The clock recovery system of claim 6 wherein the known bits are 1 bits and the bits other than the known bits are 0 bits.

8. The clock recovery system of claim 6 wherein the known bits are 0 bits and the bits other than the known bits are 1 bits.

9. The clock recovery system of claim 1 wherein the phase locked loop and bit decision block are implemented using digital circuitry.

10. The clock recovery system of claim 1 wherein the phase locked loop and bit decision block are implemented using programmable circuitry.

11. A clock recovery system for recovering an in-band communication clock in a wireless power transfer system, the clock recovery system comprising:
- a phase locked loop, the phase locked loop further comprising:
  - a phase detector that computes an error signal from a difference between an instantaneous peak location and an estimated peak location correlated to a symbol in an in-band communication bitstream;
  - a loop filter that selectively receives the error signal; and
  - a voltage controlled oscillator that adjusts its output frequency responsive to an output of the loop filter; and
- an interpolation block that applies interpolation to a plurality of samples of the in-band communication bitstream to improve timing accuracy at low sampling rates.

12. The clock recovery system of claim 11 wherein the interpolation is a quadratic interpolation.

13. The clock recovery system of claim 11 further comprising:
- a bit decision block and a multiplexer that cooperate to selectively provide the error signal to the loop filter responsive to detected bits in the in-band communication bitstream.

14. The clock recovery system of claim 13 wherein the bit decision block is responsive to known bits in the in-band communication bitstream, and the known bits are 1 bits.

15. The clock recovery system of claim 13 wherein:

the multiplexer receives the error signal at a first input and the error signal plus an offset signal at a second input;

the bit decision block is responsive to known bits in the in-band communication bitstream; and the bit decision block and multiplexer cooperate to provide the error signal to the loop filter responsive to the known bits and to provide the error signal plus the offset signal to the loop filter responsive to bits other than the known bits.

16. The clock recovery system of claim 15 wherein the known bits are 1 bits and the bits other than the known bits are 0 bits.

17. The clock recovery system of claim 15 wherein the known bits are 0 bits and the bits other than the known bits are 1 bits.

18. A method for recovering a clock from an in-band communications signal in a wireless power transfer system, the method being performed by a communications module of a wireless power transfer device and comprising selectively applying to a phase locked loop an error signal representing a difference between an instantaneous peak location and an estimated peak location correlated to symbol sampling of a bitstream of the in-band communication signal.

19. The method of claim 18 wherein selectively applying the error signal to the phase locked loop includes supplying the error signal responsive to known bits in the bitstream.

20. The method of claim 18 further comprising quadratically interpolating a plurality of samples of the bitstream to improve timing accuracy at low sampling rates.

* * * * *